United States Patent [19]

Malerba

[11] 4,355,416
[45] Oct. 19, 1982

[54] CIRCUIT ARRANGEMENT FOR THE SELECTION OF A FREQUENCY OF SIGNALS RECEIVABLE IN A RECEIVING SET

[75] Inventor: Mario Malerba, Turin, Italy

[73] Assignee: Indesit Industria Elettrodomestici Italiana S.p.A., Turin, Italy

[21] Appl. No.: 729,757

[22] Filed: Oct. 5, 1976

[30] Foreign Application Priority Data

Oct. 16, 1975 [IT] Italy .............................. 69579 A/75

[51] Int. Cl.³ .............................................. H04B 1/16
[52] U.S. Cl. .................................. 455/186; 455/165; 455/183
[58] Field of Search ................. 325/418, 421, 25, 419, 325/420, 464, 452, 459, 465; 358/91; 331/1 A, 1 T, 25; 334/15; 455/150, 164, 165, 179, 182, 185, 192, 196, 183, 208, 257, 258, 259, 265

[56] References Cited

U.S. PATENT DOCUMENTS

| | | | |
|---|---|---|---|
| 3,622,913 | 11/1971 | Shipley | 325/419 |
| 3,657,661 | 4/1972 | Jarger | 325/419 |
| 3,946,148 | 2/1976 | Skerlox | 455/192 |
| 3,961,261 | 6/1976 | Pflasterer | 455/165 |
| 3,980,951 | 9/1976 | Breeze et al. | 325/419 |
| 3,983,484 | 9/1976 | Hodama | 325/25 |
| 3,988,696 | 10/1976 | Sharpe | 331/1 A |
| 4,000,476 | 12/1976 | Walier | 455/208 |
| 4,025,953 | 5/1977 | Sideris | 325/464 |
| 4,027,242 | 5/1977 | Yamanaka | 325/421 |
| 4,038,689 | 7/1977 | Rzeszewski et al. | 358/191 |

OTHER PUBLICATIONS

A. Freq. Synthesizer for TV Receivers, by Eric Breeze, Fairchild Journal of Semi-Conductor Progress, Aug. 1974, vol. 2, No. 8, pp. 3–8.
A Uniquely Simplified TV Tuning System, by Steve Hilliker, IEEE Transactions on Consumer Electronics, Feb. 1976, pp. 61 to 68.

*Primary Examiner*—Tommy P. Chin
*Attorney, Agent, or Firm*—Ladas & Parry

[57] ABSTRACT

A circuit arrangement for the selection, the tuning and the storage of a frequency of signals receivable in a receiving set is described. The main feature of this circuit, which comprises a controlled oscillator whose frequency is determined by a control loop as a function of a number N, at least a first and a second memory circuit and a control panel, is that of having means for selecting one frequency among a plurality of receivable frequencies; means for optimally tuning said selected frequency; means for storing within the second memory circuit the information about the number N for each selected frequency; and means arranged to utilize the information stored in the second memory, about the number N, so as to enable to select again the optimally tuned frequency.

This circuit arrangement is also provided for a television signal receiving set comprising a line frequency oscillator, to select, tune in and store television channels, and comprises circuit means arranged to increase the value of the number N, when the line oscillator is synchronized by a received signal.

A further embodiment of this circuit arrangement for a television signal receiving set, arranged to select, tune in and store one of a plurality of television channels subdivided into several frequency ranges, comprises circuit means analyzing the number from the first memory circuit and arranged to supply to a tuner of the set information signals for the range change-over switching.

32 Claims, 1 Drawing Figure

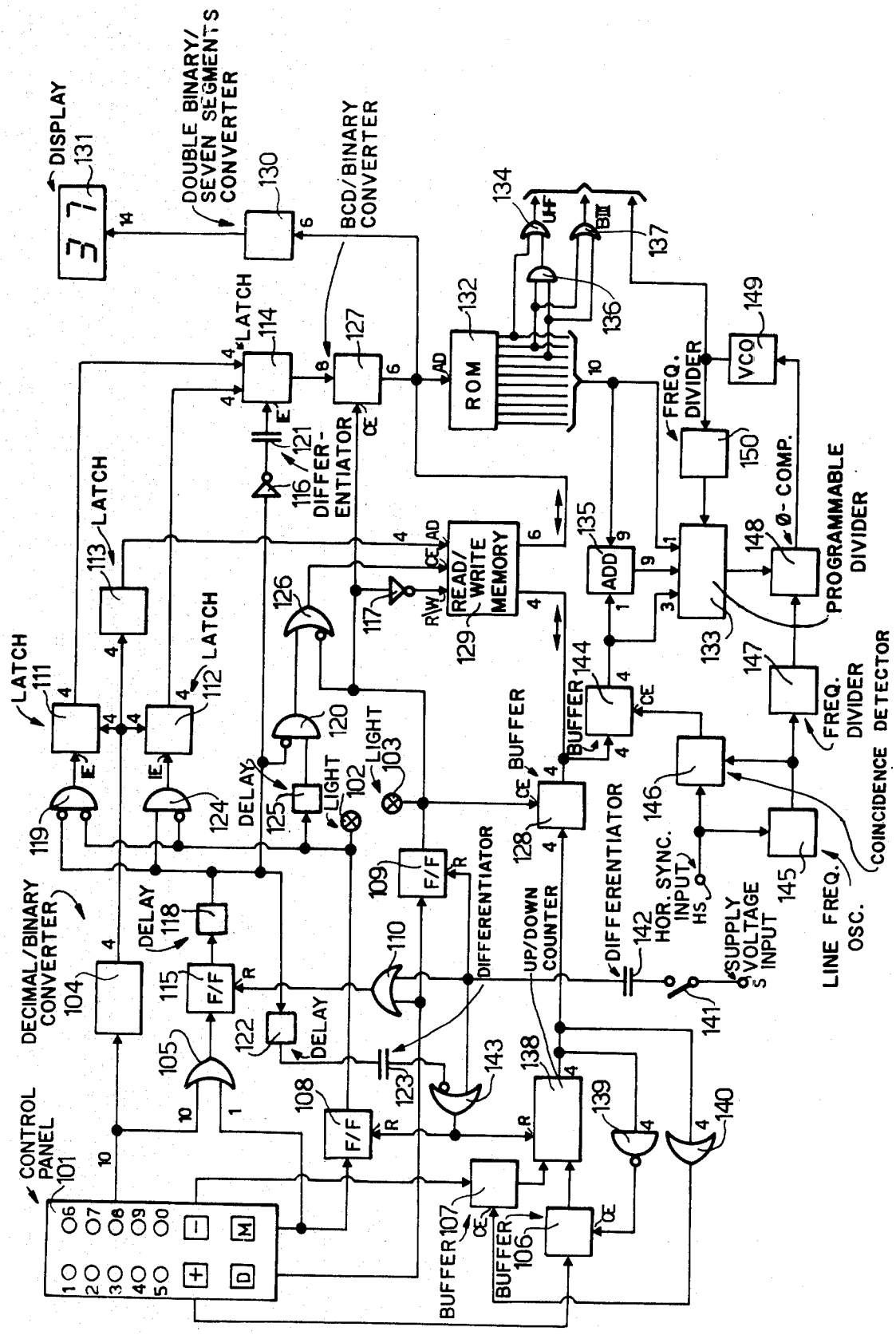

CIRCUIT ARRANGEMENT FOR THE SELECTION OF A FREQUENCY OF SIGNALS RECEIVABLE IN A RECEIVING SET

BACKGROUND OF THE INVENTION

This invention relates to a circuit arrangement for the selection of a frequency of signals receivable in a receiving set, suitable in particular for the selection and the tuning of a television channel in a television signal receiving set; said circuit arrangement comprises a Voltage Controlled Oscillator or VCO whose output signal has its frequency fixed by a control loop, as a function of a number N different for each of the selectable frequencies, and obtained from a storage circuit, in particular a circuit comprising a Read-Only-Memory or ROM. Circuit arrangements of this type have recently been proposed as completely electronic substitute devices for the electromechanical tuning devices (potentiometers) used hitherto in radio-television receiving sets, for the selection of the various television channels. The purpose of such electronic devices is to provide better performances, a better reliability and a tuning precision exempt from human error in connection with the manual tuning phase, as well as from thermal or other kinds of drifts.

In said electronic devices, a series of numbers corresponding to the various frequencies of the receivable signals is stored in a Read-Only-Memory (ROM) during the manufacturing of the set. To select a frequency, for instance that of a television channel, the number of the channel is set, for example by means of a ten digital key push-button panel as that of a pocket calculator, and is sent, as address, to the ROM which produces the number N corresponding to the frequency to be selected. In this way it is possible to select with considerable precision, for example, one hundred different frequencies. In fact, the precision depends only upon that of the reference sample frequency which may be taken from a fixed quartz oscillator.

However, said proposed device has two disadvantages: - the tuning obtained by selecting a fixed frequency corresponding to the theoretical frequency of the optimum tuning, is practically almost never the best one; this is due to the unavoidable calibration tolerances of the circuits of the set and to the alterations introduced into the received signal by its propagation and by the characteristics of the receiving antenna;

the user finds more inconvenience in having to remember the numbers of eight or ten channels which he usually desires to receive (numbers which have no connection between them, as for instance the numbers 2, 9, 12, 23, 31, 58 and so on) than in having to remember the correspondence between eight or ten channels and the order of as many keys or sensors, as he was accustomed to up to today.

Therefore, complete electronic devices have been proposed which are free from said disadvantages; these devices, instead of being based on a read-only-memory, are based on a memory to be filled and on a selection system which generates a ramp of voltage formed by a plurality of steps which are stored in the memory. However, this device, besides losing the advantages of precision, gives rise to inconveniences during the loading of the memory, which is a complicated operation and has to be effected in successive stages if all the desired channels are not active at the moment of loading.

SUMMARY OF THE INVENTION

A first object of the present invention is to provide a device for the selection of frequencies of signals receivable in a receiving set, which will not have the disadvantages of the known devices. A second object of the present invention is to provide a device which will ensure a considerable degree of precision of the selected frequency without requiring the use of a reference quartz oscillator. A third object of this invention is to render more simple and less expensive the required memory circuits.

Thus, the present invention is a circuit arrangement for the selection, the tuning and the storage of a frequency of signals receivable in a receiving set, comprising a controlled oscillator whose frequency is determined by a control loop as a function of a number N, at least a first and a second memory circuit and a control panel having at least ten numbered push buttons, wherein there are provided first means for selecting said frequency from among a plurality of receivable frequencies, said first means being activated by one or more of said numbered push buttons and forming a number P which is indicative of the frequency to be selected, said number P being supplied to said first memory circuit to correspondingly generate a stored number R suitable for forming at least a part of said number N; second means for optimally tuning said selected frequency, said second means generating signals of modification of said number N; third means for storing within said second memory circuit said number P and said signals of modification of said number N and fourth means arranged to inhibit the transmission of said number P from said first means to said first memory circuit and the transmission of said signals of modification of said number N which arrive from said second means, and to send said number P and said signals of modification of said number N, stored in said second memory circuit, to said first memory circuit, and to modify said number N, so as to enable to select again said optimally tuned frequency; said control panel further comprising additional push buttons for, respectively, causing said second means to vary said signals of modification of said number N, and activating or not activating said third storing means and said fourth means.

Moreover, a particular embodiment of the present invention applies the circuit arrangement to a television signal receiving set comprising a line frequency oscillator, which arrangement is able to select, tune in and store television channels and in which said loop for controlling the frequency of said controlled oscillator comprises a comparator having at least two inputs at which there arrive a signal obtained by dividing the frequency produced by said oscillator, at least by said number N, and a reference signal obtained by dividing by a fixed number the frequency produced by said line oscillator, wherein there are comprised circuit means arranged to increase the value of said number N at the moment at which said line oscillator is synchronized by a received signal.

A further embodiment of this invention applies the a circuit arrangement to a television signal receiving set, arranged to select, tune in and store one of a plurality of television channels subdivided into several frequency ranges, said number R being different for each of the selectable channels, wherein there are comprised sixth circuit means analysing said number R and arranged to supply to a tuner of said set information signals for the range change-over switching.

BRIEF DESCRIPTION OF THE DRAWING

The invention will now be described in details with reference to the accompanying drawing given only by way of a non limitative example and showing diagrammatically a circuit arrangement, embodying the principles of the present invention, for the selection of the channels in a television signal receiving set.

DETAILED DESCRIPTION OF THE INVENTION

In the drawing there is diagrammatically shown a control panel or Control-Board 101 having ten push buttons or sensors numbered from 0 to 9, and having, moreover, four additional push buttons or sensors distinguished by the indications +, −, D, M. The push buttons D and M may be made of a transparent material which is illuminated by two lamps (or by an equivalent source of light, such as, for example, luminous diodes LED); in the circuit diagram, the light sources corresponding to the push botton M and to the push button D are indicated by reference numerals 102 and 103 respectively. In the diagrammatic representation of the drawing, the groups of conductors which follow the same path of connection are shown by a single line, by the side of which a figure indicates how many conductors the group contains; where no figure is present, it means that the line is formed by a single conductor. Thus, for example, the control panel 101 is connected to a convertor circuit 104 (Decimal Binary Convertor) by a line composed of ten conductors, each of which is connected to one of ten push buttons indicated by numerals from 0 to 9. The same line composed of ten conductors connects the control panel 101 also to ten inputs of a OR gate 105 having eleven inputs. From each of push buttons marked + and − a single conductor line arrives at the input of a separator circuit or Buffer, 106 or 107 respectively, which is further provided with an enabling input CE (Chip Enable). Branched from push button M is a single conductor line connected to the eleventh input of the gate 105 and to an input of a bistable multivibrator or Flip-Flop 108 provided with a reset input R. Branched from push button D is a single conductor line, which is connected to an input of a bistable multivibrator 109 and to an input of an OR gate 110 having two inputs.

The output of the converter circuit 104 is connected through a four conductor line to inputs of three equal latches, indicated by reference numerals 111, 112 and 113, each of which is provided with four inputs and with an enabling input IE (Input Enable). The input IE of the latch 113 is not shown. The outputs of the latches 111 and 112 are connected, through two lines of four conductors each, to the eight inputs of a fourth latch 114 which also is provided with an enabling input IE.

The output of gate 105 is connected to the input of a bistable multivibrator 115 provided with a reset input R, this latter being connected to the output of the gate 110. Multivibrator 115, as well as multivibrators 108 and 109, have two outputs, one of which is at the opposite logic level of the other. For simplicity of representation, only one output is shown in the drawing; however, it can be seen that said output arrives sometimes to negative inputs of gates or to invertor circuits, such as those indicated by reference numerals 116 and 117. It is clear that, actually, the corresponding circuits are connected to the negative output of the respective multivibrator.

Thus, the negative output of multivibrator 115 is connected through a delay circuit 118 to:
one input of a AND gate 119 having two inputs;
one input of a AND gate 120 having two inputs;
a differentiator circuit 121 diagrammatically represented as a capacitor, through the inverter circuit 116;
and, through an additional delay circuit 122, to a second differentiator circuit 123.

The positive output of the multivibrator 115 is, in turn, connected to an input of a AND gate 124 having two inputs, also through a delay circuit 118 (the delay circuit 118, instead of being disposed on the outputs, may be disposed on input of the multivibrator 115).

The positive output of the multivibrator 108 is connected to:
the light source 102,
and, through a delay circuit 125, to the other input of the AND gate 120.

The delay circuits 118, 125 and 122, which produce a time delay equal to $\tau_1$, $\tau_2$ and $\tau_3$ respectively, are dimensioned in such a way as to have $\tau_1 < \tau_2 < \tau_3$.

The negative output of the multivibrator 108 is connected:
to the other input of the AND gate 119, and to
the other input of the AND gate 124.

The outputs of gates 119 and 124 are connected to enabling inputs IE of the latches 111 and 112 respectively.

The differentiator circuit 121 is connected to the enabling terminal IE of the latch 114.

The output of AND gate 120 arrives at an input of an OR gate 126 having two inputs.

the output of the latch 114 is connected, through a line of eight conductors, to the inputs of a data convertor 127 which converts into a single binary number P (of six bit) the two binary numbers (of four bits each) which it receives, givng them the relative weight. Converter 127 is a convertor of the data in code BCD into data in binary code; it possesses one enabling input CE. The positive output of the multivibrator 109 is connected to:
the source of light 103;
the enabling input CE of the converter 127;
the enabling input CE of a separator or buffer 128.

The negative output of the multivibrator 109 is connected to:
the other input of gate 126; and
through the inverter 117, to the read-write control input (R/W) of an RWM memory 129 (Read-Write-Memory), which conveniently is of the non volatile type with MNOS (Metal-nitride-oxide-semiconductor) elements and has ten memory cells, with a capacity of ten bits each, and in addition to the read-write input (R/W) possesses ten outputs-inputs, four address inputs (AD) and an enabling input CE. RWM memory 129, as known in the art, is a memory in each cell of which information in the form of bits can be stored (written) and successively extracted (read out) under command signals at a read/write input (which establish the writing or reading condition), at address inputs (which select the proper cell for storing or extracting the information) and at an enabling input (which gives consent to the operation of the memory). The output of gate 126 is connected to the enabling input CE of the memory 129 RWM; the output of the latch 113 is connected, through a four conductor line, to the address inputs AD of the memory RWM 129. The output of the converter 127 is connected, through a six conductor line, to:

six input-outputs, corresponding to the most significant bits, of the RWM memory 129;

the inputs of a double binary-seven segments convertor 130, which converts the binary information at the inputs into two sets of driving signals on fourteen output conductors which connect each set to a respective seven segments portion of a double luminous indicator (Display) 131 of the seven segments type;

the address inputs AD of a ROM memory 132 (Read-Only-Memory) which has 64 memory cells, having each a capacity of ten bits; this memory has, of course, ten outputs. ROM memory 132, as known in the art, is a memory in each cell of which previously stored information in the form of bits can only be furnished (read out) at the outputs under command of a command signal in the form of bits at the address inputs, which command signal selects the cell having the desired stored information.

The ten outputs of the ROM memory 132 are connected as follows:

the output which corresponds to the most significant bit is directly connected to the corresponding input of a programmable divider 133 (represented by a thirteen bit counter); the same output is connected to an input of a OR gate 134 having two inputs:

the remaining nine outputs are connected to as many inputs of a (9+1) bit logic adder 135; two of said nine outputs (those which correspond to the second and third most significant bit of the ten original bits) are connected also to the two inputs of a AND gate 136 and to the inputs of a OR gate 137.

The output of gate 136 is connected to the other input of the gate 134. The output of gate 134 supplies a signal indicating that the selected frequency is in the UHF range, and said signal is supplied to a tuner of the receiving set (not shown in the drawing).

The output of the gate 137 supplies a signal which indicates that the selected frequency is in third band (B III), said signal being supplied also to the tuner for controlling its band switch-over members. The outputs of the buffers 106 and 107 are connected to the inputs of a counter 138 able to count both up and down, from 0 to +15 (4 bit UP/DOWN COUNTER), provided with a reset input R which does not bring it to 0 but to +8. The output of the counter 138 is connected, through four conductor lines, to the inputs of:

the buffer circuit 128;
a NAND gate 139 with four inputs;
a OR gate 140 with four inputs.

The outputs of the gates 139 and 140 are connected to the enabling inputs CE of the buffer circuits 106 and 107 respectively.

A terminal S which receives the external supply voltage is connected, through a switch 141 of the set, to a differentiator circuit 142 whose output is connected:

to the reset input R of the multivibrator 109;
to the other input of the gate 110; and
to an input of an OR gate 143 having two inputs.

The other input of the gate 143 is connected to the output of the differentiator circuit 123; the output of the gate 143 is connected to the output of the differentiator circuit 123; the output of the gate 143 is connected to the reset inputs R of the multivibrator 108 and of the counter 138.

The output of the buffer 128 is connected, through lines of four conductors each, to:

the remaining four inputs-outputs of the RWM memory 129;

the inputs of a further buffer 144.

The four outputs of the buffer 144 are connected as follows:

three of them are connected to the divider circuit 133 (less significant bits)

one of them (more significant bit) is connected to an input of the adder circuit 135.

The nine outputs of the adder circuit 135 (as it will be apparent later on, the case of a carry never occurs) are connected to the remaining nine inputs of the divider 133.

A terminal HS, which receives from the corresponding section (well-known and not shown in the drawing) of the receiver set, the horizontal sync pulses, is connected:

to a line frequency oscillator 145 having a frequency stability, when it is not synchronized, of one part per thousand;

to a first input of a coincidence detector 146.

The output of oscillator 145 is connected to the second input of the detector 146 and to the input of a four stage frequency divider 147 which divides in the ratio 1:16. The output of the detector 146 is connected to the enabling input CE of the buffer 144. The output of the divider 147 is connected to an input of a phase comparator 148, whose second input receives the output of the divider 133.

The output of the comparator 148 is connected to the control input of a voltage controlled oscillator VCO 149, whose output, in addition to being supplied to the tuner, arrives at a seven stage frequency divider 150 which divides in the ratio 1:128.

The output of the divider 150 arrives at the input of the divider 133 which divides it by the ratio set by the circuits 132, 135 and 144. The programmable divider 133 is well known in the art and, as better explained later, receives a frequency input signal (from frequency divider 150) and supplies (to phase comparator 148) a frequency output signal, which is the input signal whose frequency has been divided by a programmable number (in this case, the number obtained by the combination of signals in the form of bits from circuits 132, 135 and 144).

The operation of the circuit described hereinabove will now be explained.

The proposed circuit arrangement allows two operation modes:

selection of the television channel, with direct access, during which it is possible to select directly, by forming the respective number on the control push button panel 101, one of the 64 receivable channels, whose frequency is code stored in ROM memory 132; moreover, it is also possible to effect a tuning correction, by acting on the push buttons + and − of the panel 101, by steps of 0.125 MHz each time. After having selected and eventually corrected a channel, it is possible to store such channel, with the effected correction, in RWM memory 129, in a desired position; it is possible to store up to maximum of ten channels;

selection of the television channel, with indirect access or selection, during which it is possible to select one of the channels which have been previously stored in memory 129 with the effected tuning correction, as referred to above, by pressing one of the ten digital push buttons of the push button panel 101, which selects a corresponding one of the cells of memory 129. Said indirect access is established by pressing the push button D or by switching on the set. In fact, with the latter, the three multivibrators 108, 109 and 115 are reset by means of the differentiator circuit 142, and the gates 110 and 143 and the outputs of said three multivibrators become low level (reference is made here, as well as hereinafter, unless otherwise stated, to the normal, not negative, outputs), so that the circuit arrangement is prepared for indirect selection, as will be better explained later. For accomplishing indirect access by switching on the set, however, it is assumed that memory 129 has been preloaded by the user with the desired channels. It will, however, be useful to initiate the explanation by referring to the operation off direct access. To pass to this operation mode, it is necessary to press the push button D of the panel 101. In this way, the multivibrator 109, which has been reset at the moment of switching on the set, changes state and its output becomes high, thereby producing the switching on of the light source 103, the activation of the circuits 127 and 128 and the disposition "to write" of the memory RWM 129 which, however, is disabled, since the gate 120 has an input at low level (the one which is connected to the output of the multivibrator 108 through the delay circuit 125) and, accordingly, the gate 126 has both inputs at low levels. At this point, on the push button panel 101 is formed the number of the channel to be selected, for instance the number 37, (if one wants to select a channel having a number less than 10, it is necessary to form 01, 02 etc.), by pressing first the push button having the numeral 3 and then the one having the numeral 7. The output of multivibrator 115, which is reset by pressing the push button D, becomes high level when the push button bearing the numeral 3 is pressed, and returns to low level when the push button bearing the numeral 7 is pressed.

After having pressed the push button D, the latch 111, after the time $\tau_1$ has elapsed, results in being enabled and therefore receives in binary code the number 3 coming from the converter circuit 104, but after elapsing of the time $\tau_1$ from the moment at which the push button having numeral 3 has been pressed, the latch 111 is disabled and the latch 112 is enabled and thus receives the number 7.

The latch 114 results in being enabled after the time $\tau_1$ from the moment at which the output of the multivibrator 115 becomes low level, but this enabled condition is not maintained and disappears again after a time interval dictated by the time constant of the differentiator circuit 121. Thus, the latch 114 "reads" the content of the latches 111 and 112 for a short period of time after the output of the multivibrator 115 has become low level. That is, the latch 114, when it receives a pulse at input IE through the differentiator circuit 121, changes its content by storing the information present at its inputs, namely that contained in the latches 111 and 112. Therefore, the latch 114 reads after the push button D has been pressed (and it reads zero, because none of the numbers of the latches 111 and 112 has been stored as yet), and then it reads again after the second digital push button of the panel 101, i.e. the push button which in the present example has the number 7, has been pressed. In this way, partial readings are avoided, which would produce false and troublesome intermediate tunings. As soon as the latch 114 has been charged, the number P, which in the present case is the number 37, is supplied, through the converter 127, to the input AD of the ROM memory 132 as address, which memory supplies in output a corrrresponding number R, in binary code, previously stored in it and which, in this case, is the number 637 (i.e. 1 001 111 101 in binary code).

The first bit, the most significant one, of this number is supplied directly, as the first bit of the divisor number, to the circuit 133 and, through the gate 134, serves also to indicate to the tuner that the selected channel is in the UHF band.

The other nine bits (001 111 101) are supplied to the adder 135; this latter receives also, through the buffers 128 and 144, the first bit of the number 8 (number Q) in the output from the counter 138, which has been brought to such number upon switching on and, again, after the push button bearing the number 7 has been pressed (the output of the counter 138 is brought up to the value $+8$ whenever the output of the multivibrator 115 returns to low level, through the delay circuits 118 and 122, the differentiator circuit 123 and the gate 143).

Since the first bit (which is the most significant) of the number 8 is 1 (8=1000 in binary code), the adder 135 supplies the number 001 111 110; to this number are added the three bits (three zeroes) which from the buffer 144 are sent directly to the counter-divider 133, which, therefore, receives, in the aggregate, the instruction to divide by a number N equal to 1 001 111 110 000 in binary code, i.e. by 5104=638×8. Since the comparator 148 receives the frequency of 15625÷16=976.5625 Hz (15625 Hz being the line frequency), the frequency generated by the oscillator VCO 149 is controlled to reach the value 976.5625×128×5104=638 MHz.

If the intermediate frequency of the receiver set is calibrated for the video carrier at 38.9 MHz, the receiver is thus prepared to receive a Video Carrier at the frequency 638−38,9=599.1 MHz. The video carrier of the channel 37 is, effectively, of 599.25 MHz, and consequently there is a theoretical error of tuning of 0.15 MHz. However, it is well-known that the practical tuning often differs from the theoretical one because of the reception characteristics of the receiving antenna, which unavoidably are influenced by the nature of the ground, by the presence of obstacles, etc., and also by calibration inaccuracies due to the industrial production of the receiver sets (tolerances).

It is also known that a negative frequency error is much more tolerable than a positive error, as the latter rapidly causes an unacceptable deterioration of the image because of the appearance of an audio-video cross modulation (sound bars) and/or synchronization defects. For this reason there has intentionally been introduced a negative "base error". However, if necessary, the user can always obtain a better tuning by pressing the push buttons + and − of the panel 101. Each actuation of the push button + increases by 1 the value of the output signal of the counter 138; each actuation of the push button − reduces by 1 said value. Accordingly, the division ratio of the counter 133 changes by one unit (higher or lower) and therefore the output frequency of the VCO oscillator 149 correspondingly changes by $\frac{1}{8}=0.125$ MHz. The highest possible negative correction by means of the push button − is of 8 steps equal to 1.15 MHz with respect to the theoretical frequency; the highest possible positive correction by means of the push button + is of 7 steps equal to 0.875−0.150=0.725 MHz, with respect to the theoretical frequency. After having reached one of these limit output values, i.e. 0 or +15, the counter 138 is isolated, respectively, by the push button − or by the push button +, because the buffer 106 or the buffer 107 is disabled by means of the gate 139 or 140. In this way, when the output of the counter 138 is at the value +15 (i.e. has four 1 bits) it results in being isolated by the push button + and when the output is at the value 0 (i.e. has four zeroes) it results in being isolated by the push button −, in order to prevent a sudden jump of tuning (of almost 2 MHz).

The circuits 146 and 144 serve for the following purpose.

The exactness of the tuning depends upon the precision of the oscillator 145. When a signal is received and said oscillator is synchronized by the pulses HS, the precision is that given by the transmitted signal, which is more than sufficient (in the order of a few parts per million). However, as long as the signal has not been tuned, the oscillator 145 is free and possesses a much lower precision, in the order of one part per thousand. In this situation, the detector 146 disables the buffer 144; and consequently the frequency to which the VCO oscillator 149 is brought is that which is derived only from the number supplied by the memory ROM 132, i.e., in the present case, 637 instead of 638. In this way the video carrier is displaced by 1.15 MHz towards the centre of the curve of the band pass IF (intermediate frequency) amplifier, and, therefore, even in the presence of a frequency error up to ±1.15 MHz the synchronization of the oscillator 145 is ensured.

After the oscillator 145 has been synchronized and, consequently, the frequency error has been reduced to a few kilohertz, the buffer 144 is enabled again and the exact frequency is obtained. Thanks to this artifice it is no longer necessary to use a quartz crystal in receiver. The detector 146 is normally already present in the television receivers, where it serves to change the time constant of the connection loop of the line oscillator 145 (see, for example, the integrated circuits TBA 920 and TBA 950).

The gate 137 serves to derive from the second and third most significant bits of the number supplied by the ROM memory 132 the information for the tuner, if the selected channel is in band III.

In fact, as can be seen from the Table at the end of the description, the binary numbers supplied by the ROM memory 132 for the channels in band III have a 1 in said second and third position, while all the numbers of the channels of band I have two zeroes in these positions.

From said Table it also is seen clearly how the information for the tuner is obtained by means of the gates 136 and 134, and that the selected channel is in the UHF band (gate 136 serves for the channel 21); it has to be taken into consideration that because of the construction of the tuner, a coexistence of signals from the two gates 134 and 137 is equivalent to only a signal from the gate 134, i.e. to the selected channel being pertinent to the UHF band. From said Table it also is seen clearly why the sum number supplied by the adder 135 never has ten bits; in fact, the numbers relating to the UHF band, which, apart from the number of the channel 2, are the only ones which have nine bits (taking away the most significant), nevertheless have all at least one zero in the less significant second position (in fact, they are all spaced by 8 MHz, and therefore the last three bits are always the same).

After having seen the manner of operation of the circuit arrangement of the present invention in the direct access mode, the mode for storing one or more channels (up to ten) and for having them called back (indirect access) will now be explained.

After having selected the channel 37 and eventually corrected its tuning, to store it in the first cell of the RWM memory 129 it is sufficient to press the push button M of the panel 101 and then the push button which bears the number 1. On pressing the push button M, the light source 102 is switched on, the enable inputs of the latches 111 and 112 are disabled and after the time $\tau_2$ the RWM memory 129 is prepared for being enabled (to be written) as soon as the output of the multivibrator 115 becomes low level again (the output of the multivibrator 115 becomes high level as soon as the push button M has been pressed). After having pressed the push button which bears the figure 1, the number 1 is stored in the latch 113 and after the time $\tau_1$ has elapsed (to be sure that the latch 113 is charged), the memory RWM 129 is enabled to be written. Thus, the first memory cell is written with the number 37 (which it receives from the latch 114 by means of the circuit 127) and with the tuning corrections (which it receives from the counter 138 through the buffer 128). After a time $(\tau_1+\tau_3)$, the output of the counter 138 is returned to value 8, the multivibrator 108 is reset (through the differentiator circuit 123 and through the gate 143), the light source 102 is extinguished, thereby indicating that the storage has been accomplished, and, after a further time $\tau_2$, the RWM memory 129 is again disabled. At this moment it is possible to select a new channel (by pressing two digital push buttons of the panel 101), correct its tuning by means of the push buttons + and − and store it, for example, in the second cell of the RWM memory 129 (by pressing the push button M and then the push button 2), and so on. After having stored a suitable number of channels it is possible to to pass to the indirect access mode by pressing the push button D. Thus, the multivibrator 109 is reset, the light source 103 is extinguished, the circuits 128 and 127 are disabled and the memory 129 passes to "read" and is contemporaneously enabled. In this condition, by pressing one of the ten digital push buttons of the panel 101 (for example the push button 1), the corresponding number stored in the latch 113 serves as address to the RWM memory 129 which supplies in output the corresponding channel number (for instance 37) to the ROM memory 132 and to the luminous indicator 131, as well as the four correction bits to the circuit 144. Thus, the channel 37 is tuned, with the stored tuning corrections.

Therefore, with the circuit arrangement according to the present invention it is possible to select directly a frequency among a plurality of receivable frequencies, by pressing one or more numbered push buttons of the control panel 101, to form the number P which is indicative of the frequency to be selected and which arrives at the memory 132. This memory correspondingly generates the stored number R, which is expressed in binary code and approximately corresponds to the value of the frequency which has to be produced by the controlled oscillator 149, which number R arrives at the adder circuit 135 and at the programmable divider 133, to form at least a part of the number N which determines the output frequency of the controlled oscillator.

In fact, the number N is also determined by means of the number Q, which comes from the counter 138 and is modfied by means of the push buttons marked + and −, to accordingly modify the number N and, thus, optimally tune the selected frequency.

By means of the push buttons, therefore, it is possible to store in a cell of the memory 129 both the number P and the number Q, which numbers may successively be sent, in the indirect access mode, respectively to the memory 132 and to the circuits 135 and 133 for generating the number N. This indirect access mode, in which the formation of the numbers P and Q directly by the numbered push buttons and by the counter 138 is inhibited, and in which said numbers are, instead, taken from the memory 129, is established by pressing the push button D, when in the direct access mode, or, as said before, when the set is switched on. In this latter case, in fact, it is sufficient to press a digital push button of the panel 101 for obtaining the tuning of the channel stored in the corresponding cell of the RWM memory 129, which is not volatile. Alternatively, the RWM memory 129 could be volatile (for instance of the type CMOS) but permanently fed, even with the set switched off, by a battery, which could then be recharged when the set is switched on (because of the very low consumption of the memories CMOS the duration of the charge would be no problem).

The circuit arrangement according to the present invention has, therefore, numerous advantages. First of all, it is possible to tune in an optimal manner, with completely electronic circuits, the frequency of the selected signal and to ensure a considerable precision of the selected frequency, without having to use a reference quartz oscillator. Consequently, it is possible to store, in a very simple manner for the user, the numbers of the selected channels, without having to remember the specific number of said channels but only the simple numerical order of their storage in the memory 129. Finally, said arrangement is particularly simple and consequently more reliable and less expensive.

As can be seen from the said Table, the Italian channels in the VHF band are different from the European channels. Therefore, the alternative is given to use two different ROM memories 132, one for Italy and one for the rest of Europe, or to use an ROM memory 132, with at least 65 cells, containing the various frequencies both for the Italian channels and for the European channels. For the Italian channels it may be useful to employ an indicator 131 of the alphanumeric type. The Italian channels could be selected by pressing first the push button numbered 9 and then a second push button, for example with the correspondence 1=A;2=B;3=C; etc. The selection which is initiated with the number 9 could be utilized for switching the indicator 131 into a letter-displaying condition.

It is to be noted also that for the Italian channels A and E the initial frequency error is not of 0.15 MHz but is of 0.65, since the respective frequencies are shifted by 0.5 MHz with respect to the normal raster of the other channels.

It was deemed suitable not to further complicate the circuit arrangement for the purpose of correcting such error, in consideration of the possibility of a manual correction by the use of the push buttons + and −, which is more than sufficient even for such two anomalous channels.

From the foregoing, the advantages of the arrangement according to the present invention are clearly apparent; it is also clear that numerous variations may be introduced into the circuit arrangement described by way of example, without departing from the scope of the principles of novelty contained in the inventive idea.

TABLE

| Band | European channels | Italian channels | Decimal number P | Binary number R |
|---|---|---|---|---|
| I | 02 |  | 86 | 1,010,110 |
|  |  | A | 91 | 1,011,011 |
|  | 03 |  | 93 | 1,011,101 |
|  | 04 |  | 100 | 1,100,100 |
|  |  | B |  |  |
|  |  | C | 120 | 1,111,000 |
| III | 05 | D | 213 | 11,010,101 |
|  | 06 |  | 220 | 11,011,100 |
|  |  | E | 221 | 11,011,101 |
|  | 07 |  | 227 | 11,100,011 |
|  |  | F | 230 | 11,100,110 |
|  | 08 |  | 234 | 11,101,010 |
|  |  | G | 239 | 11,101,111 |
|  | 09 |  | 241 | 11,110,001 |
|  | 10 | H | 248 | 11,111,000 |
|  | 11 | H$_1$ | 255 | 11,111,111 |
|  | 12 | H$_2$ | 262 | 100,000,110 |
| UHF | 21 |  | 509 | 111,111,101 |
|  | 22 |  | 517 | 1,000,000,101 |
|  | 23 |  | 525 | 1,000,001,101 |
|  | 24 |  | 533 | 1,000,010,101 |
|  | ... |  | ... | .......... |
|  | 67 |  | 877 | 1,101,101,101 |
|  | 68 |  | 885 | 1,101,110,101 |
|  | 69 |  | 893 | 1,101,111,101 |
| Total European channels |  |  |  | 3 + 8 + 49 = 60 |
| Total Italian channels |  |  |  | 3 + 7 + 49 = 59 |
| Total European + Italian channels |  |  |  | 5 + 11 + 49 = 65 |

What we claim is:

1. In an electronic circuit arrangement having a programmable frequency divider arranged to obtain from a voltage controlled tuning oscillator, as a function of a respective dividing number N in digital form for the tuning of each of the tunable signals in a receiver, a respective frequency signal at the output of said programmable divider, and means for comparing said respective frequency signal with a frequency reference oscillation and producing a resultant signal supplied to said voltage controlled tuning oscillator and suitable for the desired tuning, the improvement comprising in combination:

(a) a first circuit having memory means to store binary coded number R arranged to provide said binary coded number R to said programmable divider, each number R forming at least a part of said number N;

(b) a control panel having at least ten numbered push buttons;

(c) first means actuable by at least one of said push buttons to form a binary coded number P indicative of a selected frequency to which said receiver is to be tuned by said voltage controlled tuning oscillator, said number P being transmitted to said first circuit to obtain therefrom a corresponding binary coded number R;

(d) second means for generating adjustment signals representative of incremental modifications of the numerical value of said number N;

(e) a second memory circuit;

(f) third means for storing in said second memory circuit said number P and said adjustment signals; and (g) fourth means arranged to inhibit the transmission of said number P to said first circuit and to inhibit the transmission of said adjustment signals from said second means, and to transfer from said second memory circuit the number P to said first circuit and the adjustment signals stored in said second memory circuit to said programmable divider for modifying said number N, said fourth means including additional push buttons on said control panel for causing said second means to vary said adjustment signals and for controlling the actuation of said third means and said fourth means.

2. The circuit arrangement of claim 1, comprising fifth means for forming said number N, by combining said binary coded number R which, stored in said first circuit, approximately corresponds to the value of the frequency which has to be produced by said voltage controlled tuning oscillator, with a second binary coded number Q, which represents said adjustment signals of modifications of said number N.

3. The circuit arrangement of claim 2, wherein said fifth means comprise an adder circuit which receives parts of said numbers R and Q, and said programmable divider which receives other parts of said numbers R and Q and the output of said adder circuit.

4. The circuit arrangement of claim 1, wherein said second means comprise a counter arranged to count up and down and to generate a binary coded number representing said adjustment signals of modification of said number N.

5. The circuit arrangement of claim 4, wherein said counter is made to count up or down one step at a time by means of said additional push buttons on said control panel, said counter being provided with locking means which act at the moment at which said counter has reached the maximum counting it can perform or at the moment at which it is at zero, in order to prevent it from passing from the maximum count to zero or vice versa.

6. The circuit arrangement of claim 4, wherein there are provided reset means arranged to reset said counter to a predetermined number corresponding approximately to half of the maximum count it is able to perform, said reset means being arranged to act whenever said receiver is switched on or whenever the selection of a new frequency is started.

7. The circuit arrangement of claim 1, wherein said third means comprise logic gates for enabling said second memory circuit to store said number P and said adjustment signals, and memory circuit elements connected through code converter circuits to said numbered push buttons of said control panel and adapted to address into a desired memory cell of said second memory circuit said number P and said adjustment signals.

8. The circuit arrangement of claim 1, wherein said fourth means comprise circuit elements provided with control inputs, arranged to inhibit or not to inhibit the direct transmission of said number P and of said adjustment signals, said control inputs being controlled both by means of said additional push buttons of said fourth means and by means of a switch of said receiver, said fourth means further comprising circuit elements for enabling said second memory circuit to transfer said number P and said adjustment signals respectively to said first circuit and for modifying said number N, and memory circuit elements connected through code converter circuits to said numbered push buttons of said control panel and arranged to allow reading out from a desired memory cell of said second memory circuit said number P and said adjustment signals.

9. The circuit arrangement of claim 1, wherein said first means comprise memory circuit elements connected through first code converter circuits to said numbered push buttons of said control panel, second code converter circuits arranged to form through said memory circuit elements said binary coded number P, and logic gates for enabling said memory circuit elements.

10. The circuit arrangement of claim 1, wherein the memory means of said first circuit comprises a read-only-memory (ROM).

11. The circuit arrangement of claim 1, wherein said second memory circuit comprises a read-write memory.

12. The circuit arrangement of claim 11, wherein said read-write memory is a non-volatile memory.

13. The circuit arrangement of claim 12, wherein said non-volatile memory is a memory with MNOS elements.

14. The circuit arrangement of claim 1, comprising alphanumeric indicating means for indicating the selected frequency.

15. The circuit arrangement of claim 14, wherein said indicating means indicate in decimal form said number P.

16. The circuit arrangement of claim 1, in which said receiver is a television signal receiving set for the selection, tuning and storage of one of a plurality of television channels grouped into a plurality of frequency ranges, said number R being different for each of the selectable channels, the arrangement including sixth circuit means arranged to analyse said number R and arranged to supply to a tuner of said set signals for controlling the frequency range switching.

17. The circuit arrangement of claim 16, wherein said sixth means comprise a first logic gate which receives the second and the third most significant bits of said binary coded number R, and a second logic gate which receives the output of said first gate and the most significant bit of said number R, the output of said second gate indicating whether or not the selected television channel is in the UHF range.

18. The circuit arrangement of claim 17, wherein said sixth means comprise a third logic gate receives the second and third most significant bits of said number R, the outputs of said second and third gates together indicating whether or not the selected television channel is in a given VHF band (band III).

19. The circuit arrangement of claim 17, wherein said number R expresses in binary code the frequency in MHz of the video carrier of the channel to be received, increased by 37.75 MHz.

20. The circuit arrangement of claim 1, wherein said receiver is a television signal receiving set, and said frequency reference oscillation is obtained from a local oscillator of the set, synchronizable by a received external signal, and wherein circuit means are arranged to automatically provide modification of the value of the number N when said local oscillator is running, but not yet synchronized by said external signal and when the receiver is in condition for receiving a tunable signal including said external signal for automatically securing synchronization of said local oscillator by said external signal.

21. The circuit arrangement of claim 20, wherein said modification of the value of said number N is a decrease of its value.

22. The circuit arrangement of claim 21, wherein said decrease of the value of the said number N is equal to a number Q.

23. The circuit arrangement of claim 21, wherein said circuit means comprise a circuit element having a control input and arranged to inhibit or not to inhibit the transmission of adjustment signals of modification of said number N.

24. The circuit arrangement of claim 23, wherein said adjustment signals of modification of said number N represent a number Q which constitutes a part of said number N representing fine tuning.

25. The circuit arrangement of claim 23, wherein said circuit means further comprise a coincidence detector provided with two inputs, one being arranged to receive, in use, a synchronization signal for said local oscillator, and the other being arranged to receive, in use, the signal produced by said local oscillator, the output of said coincidence detector being connected to the control input of said circuit element of said circuit means.

26. The circuit arrangement of claim 25, wherein said local oscillator is synchronized by line frequency pulses of said received external signal, and said frequency reference oscillation is obtained by dividing by a fixed number the frequency produced by said local oscillator.

27. An electronic tuning circuit arrangement having a programmable frequency divider arranged to obtain from a voltage controlled tuning oscillator, as a function of a respective dividing number N in digital form for the tuning of each of the tunable signals in a receiver, a respective frequency signal at the output of said programmable frequency divider, and means for comparing said respective frequency signal with a frequency reference oscillation and producing a resultant signal which is supplied to said voltage controlled tuning oscillator and suitable for the desired tuning, wherein said frequency reference oscillation is obtained from a local oscillator, synchronizable by a received external signal included in said tunable signals, and wherein circuit means are arranged to automatically provide modification in said programmable frequency divider of the value of said number N when said local oscillator is running but not yet synchronized by said external signal and when the receiver is in condition for receiving a tunable signal, including said external signal for automatically securing synchronization of said local oscillator by said external signal.

28. The circuit arrangement of claim 27, wherein said modification of the value of said number N is a decrease of its value.

29. The circuit arrangement of claim 28, wherein said circuit means comprise a circuit element having a control input and arranged to inhibit or not to inhibit the transmission of signals of modification of said number N.

30. The circuit arrangement of claim 29, wherein said signals of modification of said number N represent a number Q which constitutes a part of said number N representing fine tuning.

31. The circuit arrangement of claim 29, wherein said circuit means further comprise a coincidence detector provided with two inputs, one being arranged to receive, in use, a synchronization signal for said local oscillator, and the other being arranged to receive in use, the signal produced by said local oscillator, the output of said coincidence detector being connected to the control input of said circuit element of said circuit means.

32. The circuit arrangement of claim 31, wherein said local oscillator is synchronized by pulses of said received external signal, said frequency reference oscillation being obtained by dividing by a fixed number the frequency produced by said local oscillator.

* * * * *